US005407263A

United States Patent [19]
Jones et al.

[11] Patent Number: 5,407,263
[45] Date of Patent: Apr. 18, 1995

[54] RESTRUCTURABLE ENCLOSURE WITH MULTI-PURPOSE MOUNTING BLOCKS

[75] Inventors: Trent T. Jones, White Bear Lake; Robert G. Lau, Anoka; John S. Abbott, Plymouth; J. Michael Dwyer, Elk River, all of Minn.

[73] Assignee: Federal-Hoffman, Inc., Anoka, Minn.

[21] Appl. No.: 799,547

[22] Filed: Nov. 27, 1991

[51] Int. Cl.⁶ .............................................. A47B 49/00
[52] U.S. Cl. .................................. 312/265.1; 49/382; 312/265.6; 312/329
[58] Field of Search ................... 312/334.6, 329, 265.4, 312/265.6, 265.3, 265.2, 265.1; 52/488, 489, 710, 280, 282.4, 475.1, 476, 477, 656, 657; 361/600, 730, 752, 829, 627, 724, 633; 49/382

[56] References Cited

U.S. PATENT DOCUMENTS

| | | |
|---|---|---|
| 4,643,319 | 2/1987 | Debus .................................. 312/140 |
| 4,947,583 | 8/1990 | Inui ....................................... 49/382 |
| 5,202,818 | 4/1993 | Betsch et al. . | |

FOREIGN PATENT DOCUMENTS

| | | |
|---|---|---|
| 285857 | 10/1988 | European Pat. Off. . |
| 402276 | 12/1990 | European Pat. Off. . |
| 1271803 | 7/1963 | Germany . |
| 4111402 | 10/1991 | Germany . |
| 978527 | 12/1964 | United Kingdom . |

OTHER PUBLICATIONS

Picture A—Schroff Hinge Assembly.
Picture B—Schroff Side Panel Mount.
FIG. C—Hoffman sketch of Schroff Blocks—Mar. 13, 1992.
Schroff tecnorack Brochure—Mar. 1989.
Hoffman Installation Instruction for D-20 Access Panel.
Hoffman Installation Instruction for D-20 Door Panel.
Hoffman CAD drawing No. 31C59—Installation instructions for D-20 Sub-panel assembly.
Sarel Spacial 6000 Brochure, undated.
Sarel Catalogue, U.K. edition, 1991-1992, pp. 87-105.

*Primary Examiner*—Kenneth J. Dorner
*Assistant Examiner*—Gerald A. Anderson
*Attorney, Agent, or Firm*—Schroeder & Siegfried

[57] ABSTRACT

A restructurable enclosure having a plurality of mounting blocks which are secured to the body of the enclosure at various spaced locations around and adjacent the outer peripheral portions of the door and wall panel openings therein. Each of the mounting blocks includes a plurality of threaded bores in the bottom surface thereof which communicate with openings in the enclosure body to facilitate permanent mounting of such blocks to the enclosure, and to facilitate attachment of sub-panels and other assemblies within the interior thereof, without obstructing the same. Each block also includes a pair of threaded or open bores extending inward from its outer mounting surface to facilitate mounting of the enclosure door or various wall panels to the enclosure solely from the exterior of the enclosure, without the need for accessing the interior thereof. The mounting blocks are arranged such that a door panel connected thereto can be easily removed with its hinges intact and reversibly remounted from the outside of the enclosure without moving or adding any additional parts. The door and various wall panels which are mounted to such blocks are also readily interchangeable, if desired, since the mounting blocks are cooperatively mounted in similar positions on both the front and rear sides of the enclosure.

35 Claims, 11 Drawing Sheets

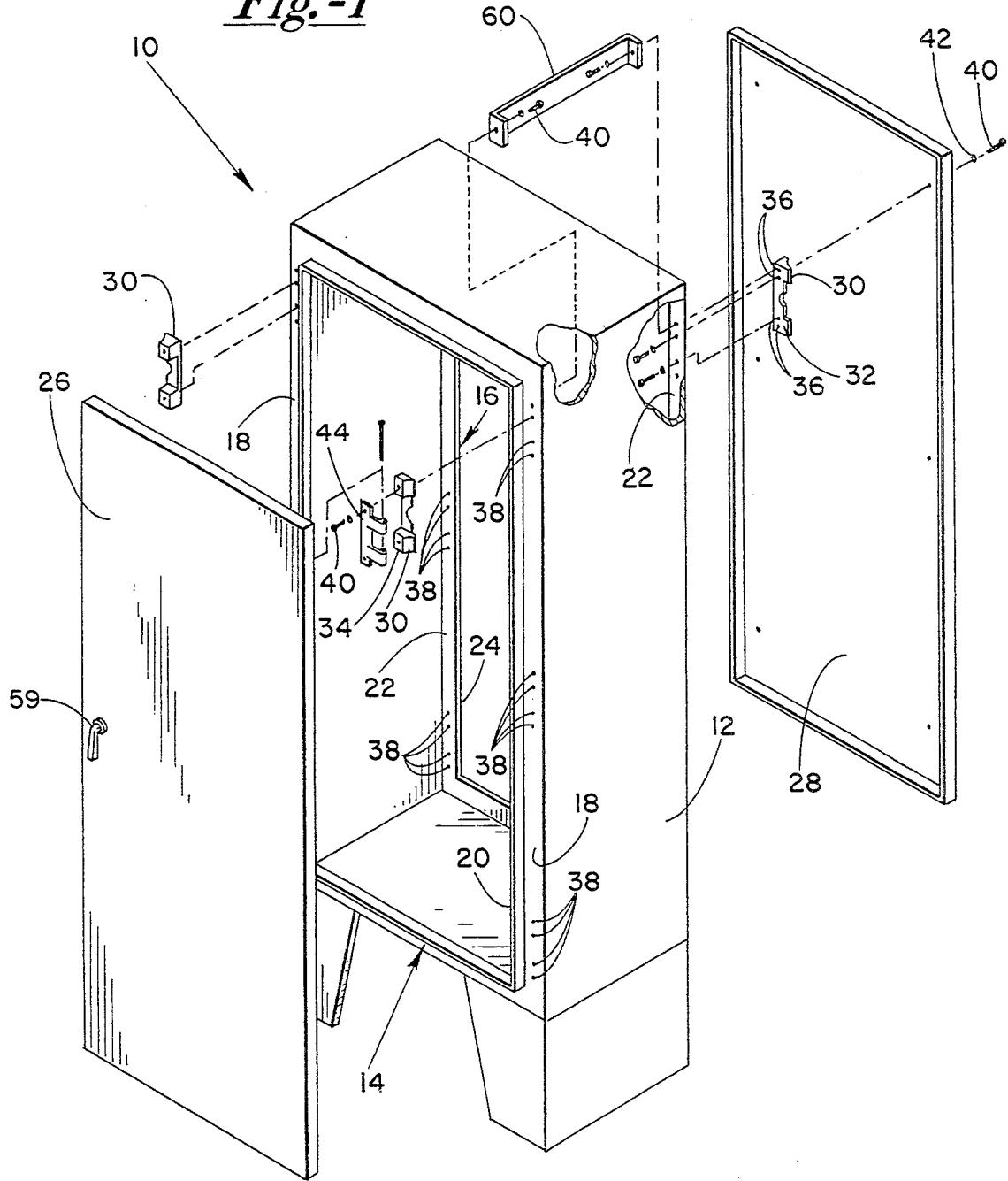

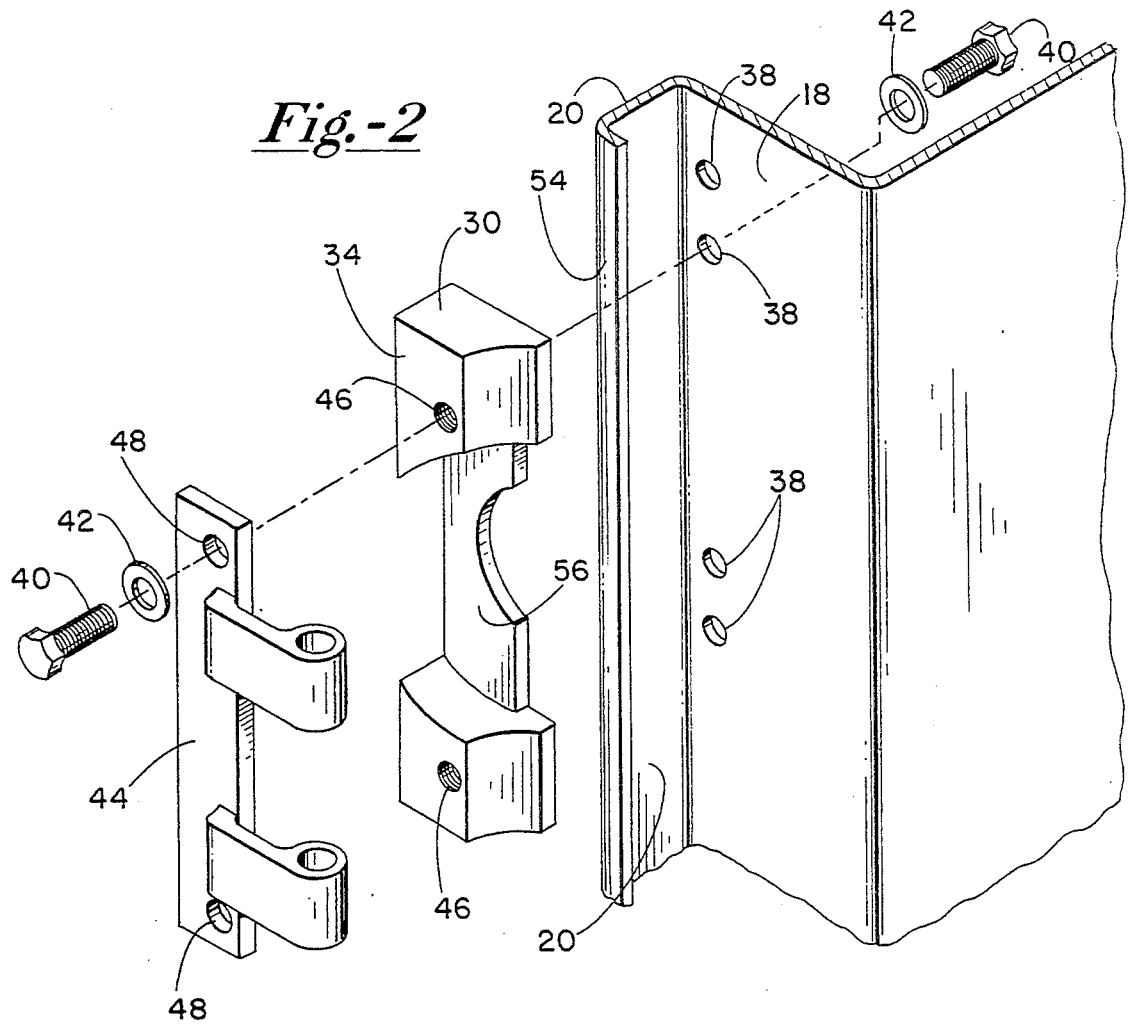
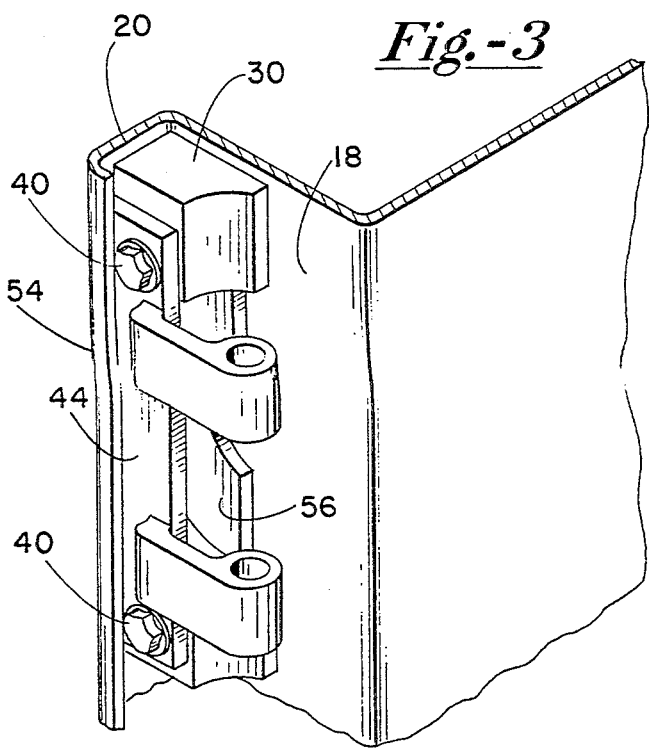

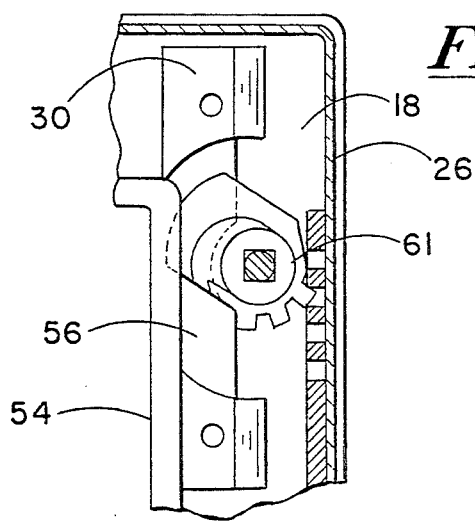
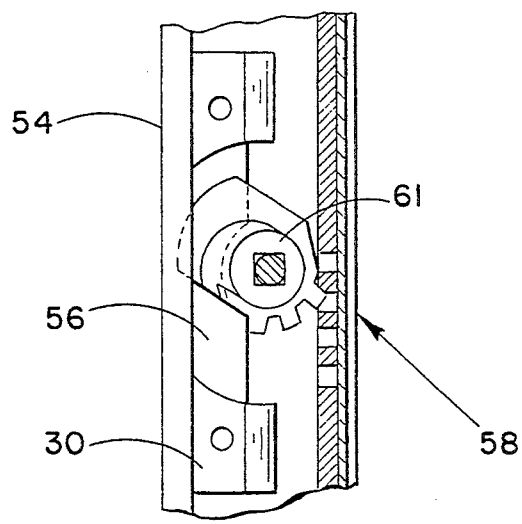
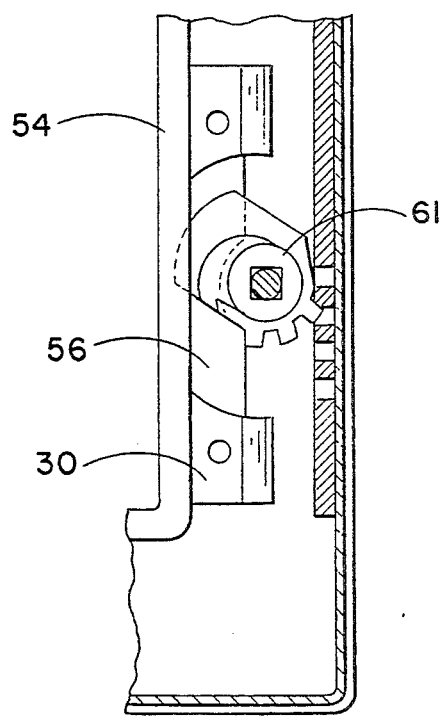
Fig.-6

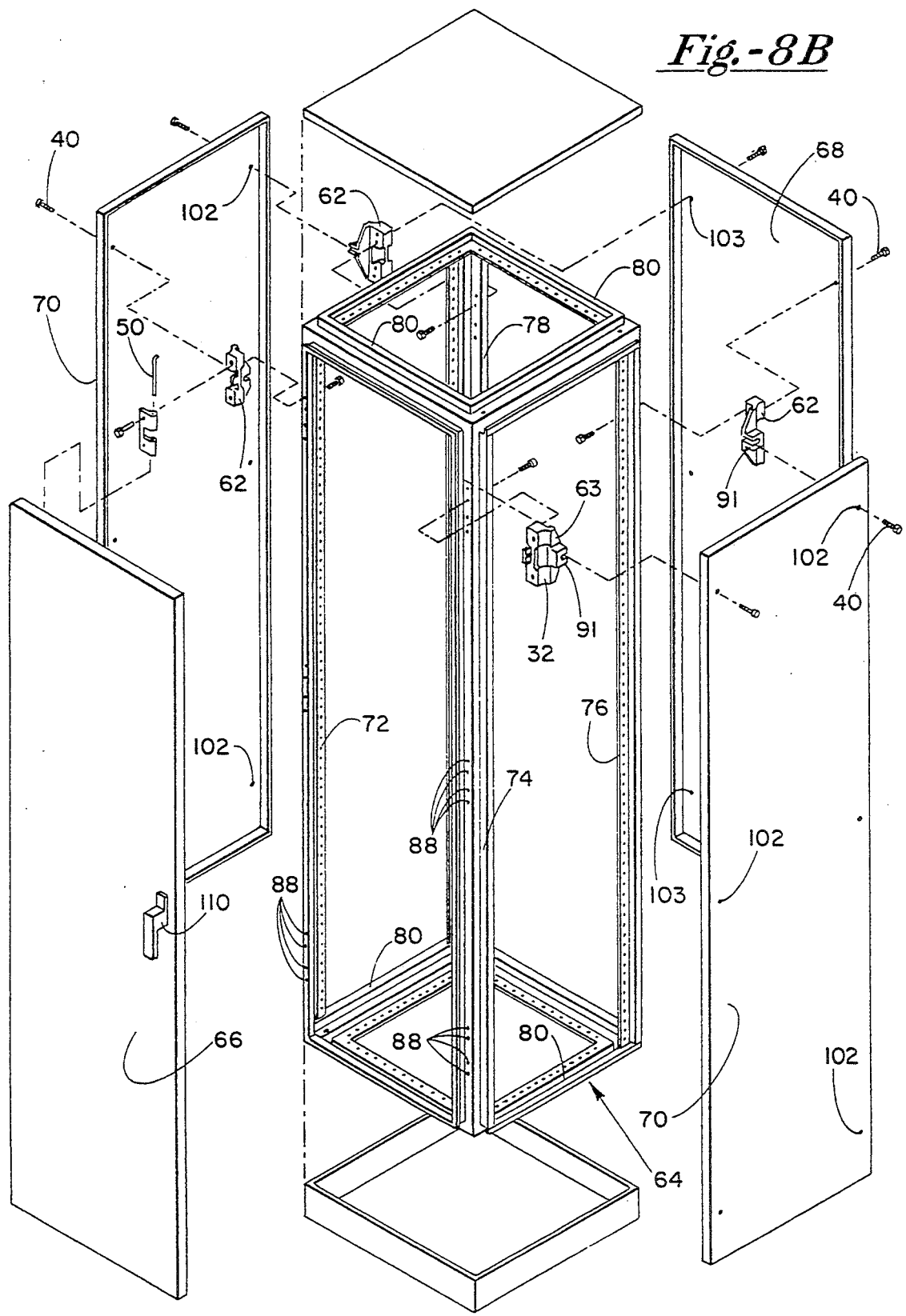

RESTRUCTURABLE ENCLOSURE WITH MULTI-PURPOSE MOUNTING BLOCKS

BACKGROUND OF THE INVENTION

The invention disclosed herein is related generally to the art of manufacturing enclosures and cabinets which are utilized to house a plurality of interior mounting boards and accessories for holding electrical components, etc. More specifically, the instant invention is related to a highly versatile enclosure which can be readily restructured by providing for removal and reversibility of door and wall panels solely from the exterior of the enclosure.

It has become increasingly important in manufacturing electrical enclosures that the manufacturer be able to meet the changing demands of its customers and provide a highly versatile enclosure which can be readily restructured and modified to meet their changing needs. Enclosures of the type described herein are often filled to their capacity with sub-panel mounting boards and other assemblies. For this reason, it is also desirous to utilize the interior space of such enclosures as efficiently as possible, and to provide an interior which is substantially obstruction-free, thereby increasing the usable space therein.

Once such an enclosure is filled with sub-panels, etc., it becomes very difficult to access the interior space thereof without the removal of some or all of the sub-panels and assemblies which are contained therein. For this reason, it is often difficult to remove and reverse doors or other wall panels of such enclosures to meet a customer's changing needs, since conventional enclosures generally require access to its interior in order to disassemble and remove doors and other panels for restructuring purposes. For instance, with a conventional enclosure, to remove and reverse the door panel, it is necessary to access the interior of the enclosure to disconnect the nuts from the bolts which secure the door hinge to the enclosure. This becomes extremely difficult and cumbersome when the enclosure is filled to maximum capacity with interior sub-panels, etc. The same is true if one wishes to remove one of the other wall panels which define the enclosure, such as the rear or side panels.

As can be seen from the above, there is a distinct need for an enclosure which is readily restructurable to meet the changing needs of the customer, and does not require access to the interior of the enclosure for accomplishing same. There is also a distinct need to maximize the usable interior space of such enclosures, and to provide a means for mounting removable sub-panels, racks, and other assemblies within the interior thereof without requiring a large number of obstructing interior support members.

The above needs and objectives are met through the use of our separate external mounting blocks, which are utilized in connection with such enclosures, as described herein as the subject matter of our invention. The invention described herein provides for solely external mounting, removal, and reversibility of the various door, rear and side wall panels of an enclosure so as to provide for ease in restructuring the same, without the need for accessing the interior thereof. The invention described herein also provides a plurality of externally mounted support structures which can be utilized for mounting interior sub-panels and assemblies, without obstructing the interior space of the enclosure.

BRIEF SUMMARY OF THE INVENTION

As stated above, the purpose of this invention is to provide an enclosure which is readily restructurable without the need for accessing the interior of the enclosure, and to provide mounting structures for interior sub-panels, etc., which do not obstruct the interior space of the enclosure. The above objectives are met through the use of a plurality of separate external multi-purpose mounting blocks which are permanently connected to the exterior surface of an enclosure body or frame to provide structure upon which external wall or door panels may be secured, and to provide external mounts for interior accessories, such as sub-panel mounting boards, racks and other assemblies.

The invention described herein provides for external connection of the various front, rear and side panels of such an enclosure to the frame thereof. The phrase "external connection", or any similar variation thereof, as used throughout this specification and in the appended claims, means that the structure being referenced can be readily installed and removed solely from the exterior of the enclosure, without the need to access the interior thereof.

Each mounting block contains a plurality of threaded bores which extend from its bottom surface into the body of the block. In one embodiment of the instant invention, such blocks are arranged and spaced in an identical manner on each side of the door opening of the enclosure. Apertures in the enclosure are provided which communicate with the threaded bores in the base of the mounting blocks. Each mounting block is permanently secured to the enclosure body by use of a screw extending from the interior of the enclosure through one of said apertures in the enclosure and into the threaded bore of 10 the mounting block. Each mounting block is secured at spaced locations on the outer surface of the door opening-defining portions of the enclosure. As such, none of the blocks extend inwardly into the interior confines of the enclosure, thereby minimizing the obstruction thereof.

Additional threaded bores in the base of such blocks, which are similar to those used for mounting the blocks to the enclosure, communicate with other apertures in the enclosure body. Such additional threaded bores in the mounting blocks provide means by which interior racks and other accessories can be secured to the enclosure body, via the external mounting blocks, without the use of interiorly extending support brackets.

Opposite the base of each block is an exterior mounting surface which includes a pair of threaded or open bores extending therefrom into or through the body of the block toward its base. The hinges of the door panel can be mounted directly to the blocks through the use of exterior mounting screws or bolts which are inserted through apertures in the hinges into the bores in the mounting surface of the block. If mounting bolts are used, such bolts screw into recessed nuts in the base of each block for tightening the door hinges thereto. Such screws or bolts are accessible solely from the exterior of the enclosure, and there is no need to access the interior of the enclosure while installing or removing the door panel. As a consequence thereof, the existing door panel can be removed and reversed, or replaced, without having to remove any of the interior sub-panels or accessories in the enclosure.

The mounting blocks are arranged and permanently secured to opposite sides of the door opening such that each block has a similarly positioned block on the opposite side of the door opening. Such arrangement of the blocks facilitates ease in removing and reversing a door panel without installing or removing additional parts. The door may be simply disconnected from the mounting blocks on one side of the opening, then inverted or replaced, and remounted to the mounting blocks on the opposite side of the door opening. Such blocks may serve another function as well. If desired, the blocks may be constructed and arranged to function as catches for a single or multi-point door latch system, which is carried by the door.

Such mounting blocks can also be used to secure the rear wall panel of the enclosure to the enclosure body. Again, the blocks are mounted on the exterior of the enclosure body adjacent the opening-defining portion for the rear wall panel. The rear panel is secured to the enclosure through external connection, with the use of one or more mounting bolts or screws, to the mounting surface of the mounting blocks. Such mounting blocks are identical in shape and construction to the mounting blocks which are used to mount the door panel, and are arranged such that the rear panel and door panel are readily interchangeable, so as to make the enclosure more versatile and restructurable. Such mounting blocks which are used to secure the rear panel to the enclosure body also include threaded bores in the base thereof which communicate with apertures in the enclosure, thereby providing additional mounting supports for interior sub-panels and accessories.

Using an alternative embodiment of the instant invention, the blocks are designed for use with a modular enclosure frame assembly. Such alternative blocks are designed to facilitate mounting of the side panels of an enclosure, as well as the front door and rear panel thereof. The above-mentioned modular frame assembly, which has been designed to accommodate such blocks, is the subject of co-pending patent application Ser. No. 07/799,408 entitled MULTIFACETED MODULAR ENCLOSURE FRAME WITH INTEGRAL SUB-PANEL GUIDE SYSTEM, the contents of which are incorporated herein by reference thereto.

In this embodiment, each block is constructed and mounted to one of the upstanding frame sections in a similar manner to that previously described, but includes an additional integral mounting flange which extends normal to the plane of the original mounting surface. The added mounting flange of each block wraps around the corner of the upstanding enclosure frame section to which it is attached, and provides an external support to which each side panel of the enclosure can be externally connected.

Such side panels are secured to the added mounting flanges with similar mounting bolts, which thread into locking nuts that are carried by the added mounting flange of each block. Using the above structured mounting blocks, the side panels of an enclosure can be mounted to the same blocks as the front door and rear panel are mounted, thereby providing for efficient external mounting of all enclosure wall panels, without requiring access to the interior thereof. In addition to the above, such modified blocks also function as mounting supports for interior accessories, and may include a catch for the door latch as well.

From the above, it can be seen that such mounting blocks have the dual purpose of providing for external connection of some or all of the door, rear and side panels of an enclosure, as well as providing external supports for interior racks and other accessories. In addition, such blocks may function as catches for a single or multi-point door latching system, if desired. Such blocks are mounted on the exterior of the enclosure frame and do not obstruct the enclosure's interior space. Through the use of such mounting blocks, the door, rear and side panels of an enclosure can be readily installed, removed, reversed or interchanged without requiring access to the interior of the enclosure, and without the need for removal of any interior sub-panels or accessories. Such mounting blocks can be used with any size enclosure, including both single and double door enclosures.

BRIEF DESCRIPTION OF THE DRAWINGS

These and other objects and advantages of the invention will more fully appear from the following description, made in connection with the accompanying drawings, wherein like reference characters refer to the same or similar parts throughout the several views, and in which:

FIG. 1 shows a perspective exploded view of a restructurable enclosure embodying our invention and exemplifying the mounting and use of our new multipurpose mounting blocks;

FIG. 2 shows a fragmentary exploded perspective view of one of our new multi-purpose mounting blocks, showing how the same is mounted to the body of an enclosure and how a door hinge may be mounted to the mounting surface thereof;

FIG. 3 shows a fragmentary perspective view of the mounting block and hinge shown in FIG. 2 in its assembled state and mounted to the body of the enclosure;

FIG. 6 is a fragmentary front vertical sectional view taken through the front closed door of an assembled enclosure similar to that shown in exploded perspective in FIG. 1, showing the relative positioning of the mounting blocks in relation to the door latching system;

FIG. 8B is an exploded perspective view of a restructurable enclosure having removable front, rear and side panels, exemplifying the use and mounting of our alternative embodiment of the multi-purpose mounting block at the uppermost portion of the enclosure, the lower blocks being mounted thereon in an identical manner, as shown in FIG. 8A;

DETAILED DESCRIPTION OF THE INVENTION

Figure 4:
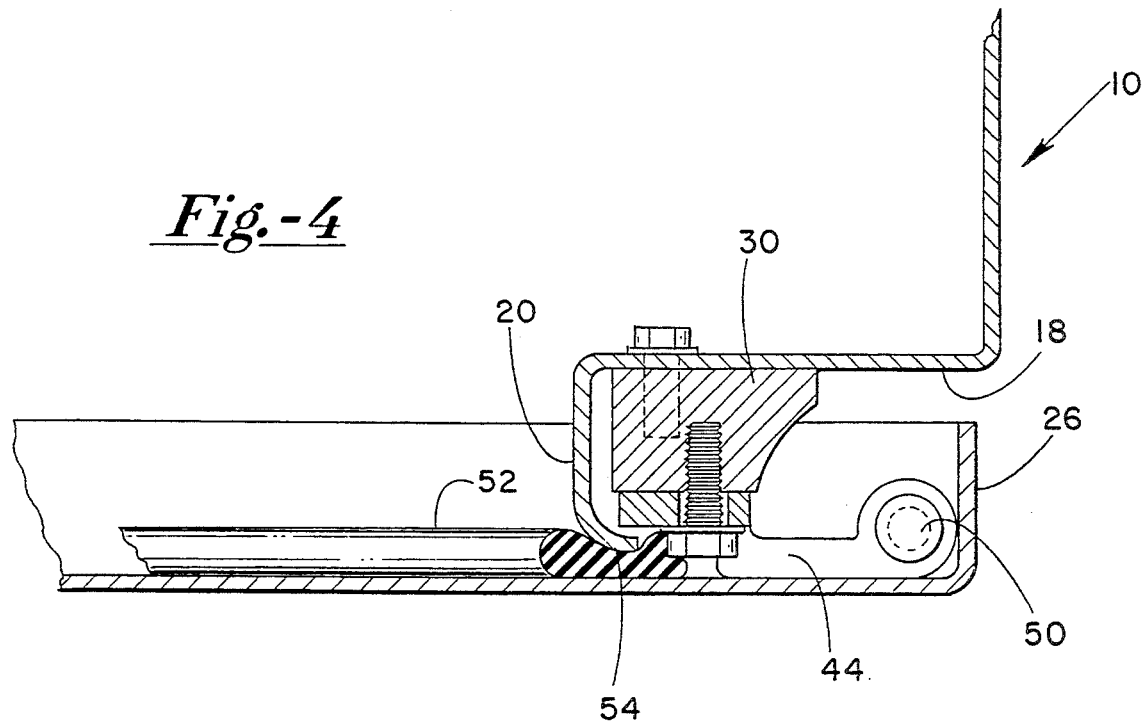
FIG. 4 is a cross-sectional view taken along a horizontal plane through the mounting block of an assembled restructurable enclosure similar to that shown in FIG. 1, showing the external connection of a door panel to the mounting surface of one of the multi-purpose mounting blocks.

For reasons previously discussed, in order to meet the ever-changing demands of customer needs, it is desirable to manufacture a readily restructurable enclosure 10 such as that shown in FIG. 1. Enclosure 10 is basically comprised of body portion 12 which has integral top, bottom and side portions which wrap around to form similar front and rear opening-defining portions 14 and 16, respectively. The front opening-defining portion 14 comprises a flat peripheral planar portion 18 which terminates with an outwardly extending peripheral flange 20. Similarly, the rear opening-defining portion 16 comprises a flat peripheral planar portion 22 with a rearward extending outward peripheral flange 24. The structure as described above and shown in FIG. 1 is designed such that the front door panel 26 and rear wall panel 28 are configured similarly and constructed of the same dimensions so as to be readily removable and reversible, if desired.

Figure 5A:
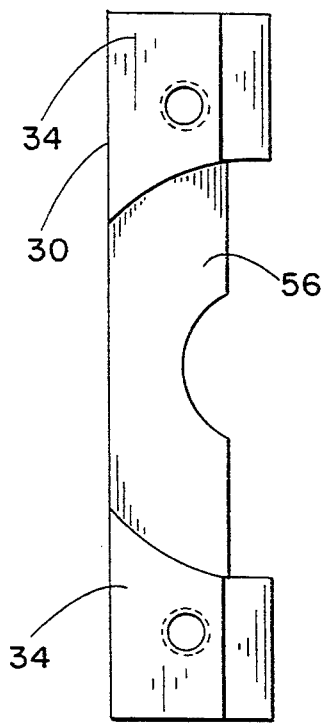
FIG. 5A is a top plan view of one of the multi-purpose mounting blocks utilized in connection with a restructurable enclosure similar to that shown in FIG. 1.
Figure 5B:
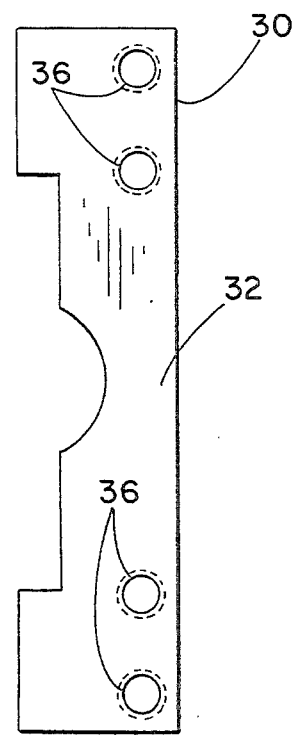
FIG. 5B is a bottom plan view of one of the multi-purpose mounting blocks used in connection with a restructurable enclosure similar to that shown in FIG. 1.

As best shown in FIGS. 1 and 2, either one or both of the front door panel 26 and rear panel 28 are mounted to enclosure 10 via our new multi-purpose mounting blocks 30. As shown in FIGS. 5A and 5B, each mounting block 30 has a base surface 32 and a mounting surface 34. The base surface 32 of each mounting block 30 has a plurality of threaded mounting holes 36, which facilitate mounting of each mounting block 30 to the front and rear peripheral portions 18 and 22 of enclosure 10.

As best shown in FIG. 2, each threaded bore 36 in mounting block 30 is designed to cooperatively align with one set of apertures 38 in the front or rear peripheral portions 18 and 22 of enclosure 10. A plurality of such apertures 38 are spaced about the peripheral portions 18 and 22 of the enclosure. For exemplary purposes, and to prevent cluttering of the drawings, only a few of the mounting blocks are shown in FIG. 1, it being understood that a plurality of such mounting blocks are to be mounted about the peripheral portions 18 and 22 of enclosure 10, adjacent the mating apertures 38 therein. Each mounting block 30 is secured at various spaced locations about the periphery of opening-defining portions 14 and 16 via at least one bolt 40 which carries a washer 42 and extends from the interior of enclosure 10 through one of said apertures 38 to thread into one of the threaded bores 36 in the base surface 32 of mounting block 30. Once secured to the enclosure body, such mounting blocks 30 need never be removed.

With each of the mounting blocks 30 permanently secured at spaced locations about the peripheral portions 18 and 22 of enclosure 10, the front door panel 26 and rear panel 28 may be externally connected to such blocks with relative ease. With specific reference to the front door panel 26, it can be seen from FIGS. 1–4 that each door hinge 44 may be externally connected to the mounting surface 34 of mounting block 30 via a similar bolt 40. Mounting block 30 has a pair of threaded bores 46 extending from the mounting surface 34 toward the base surface 32 thereof. Each door hinge 44 has a pair of openings 48 which cooperatively align with threaded bores 46 in mounting block 30, and receive bolts 40 therethrough for external connection of the door hinge 44 to the mounting surface 34 of mounting block 30 (see FIG. 3). In a similar manner, bolts 40 are used to secure the rear panel 28 to the mounting surface 34 of the mounting blocks 30, which are attached to peripheral portions 22 of enclosure 10.

As best shown in FIG. 4, the front door panel 26 (which carries unshown cooperative hinge elements) is mounted on each hinge 44 via a conventional pin 50. Door panel 26 carries a seal 52 on its inner surface which bears against the outer lip portion 54 of flange 20 when the door panel is pivoted to a closed position.

As stated previously, each mounting block 30 is mounted to enclosure 10 at spaced locations along the peripheral portions 18 and 22 of enclosure 10. Each mounting block 30 is cooperatively spaced and positioned about such peripheral portions 18 and 22 to enable removal of the front door panel 26 and rear panel 28, and reversal thereof, if so desired. Because of the cooperative positioning of such mounting blocks 30, it is only necessary to remove the outer bolts 40 which connect such panels to the exterior mounting surface 34 of each respective block 30. Such panels may be easily reversed and remounted entirely from the exterior of the enclosure, without the need for accessing the interior thereof or moving any interior panels or accessories. Moreover, front door panel 26 may be easily reverse mounted on the front surface of enclosure body 12, since mounting blocks 30 are provided on both sides of opening defining portions 14.

As best shown in FIG. 6, each mounting block 30 has a recessed central portion 56 which is designed to facilitate unobstructed movement of the door latching system 58, regardless of which side of door panel 26 the door latching system 58 is located. Upon turning door handle 59, a plurality of cam-pinions 61 are caused to rotate within the recessed portions 56 of mounting blocks 30. The cam-pinions 61, which are carried by the door panel 26, rotate and catch on lip portion 54 of flange 20 on the enclosure, thereby locking the door in tightly sealed relation with the enclosure body 12. Although mounting blocks 30 are not designed to enable a single or multi-point door latch system to catch and secure thereto, such blocks can be designed to serve this function, as will be shown and described later. The door latching system 58 is the subject of co-pending patent application Ser. No. 07/800,051 entitled MULTIPLE POINT CAM-PINION DOOR LATCH SYSTEM, the contents of which is incorporated herein by reference thereto.

As stated previously, and best shown in FIG. 5B, each mounting block 30 has a plurality of threaded bores 36 extending from its base surface 32 toward its mounting surface 34. Each block is designed to utilize two of such threaded bores 36 for mounting the block 30 to enclosure 10. The remaining two threaded bores 36 cooperatively align with mating apertures 38 in enclosure 10, and provide means by which an internal structural mount 60 (shown in FIG. 1) can be mounted to the external mounting block 30. By providing for connection of such internal structural members 60 to an external mounting block 30, less interior space of enclosure 10 is utilized for such mountings, thereby providing more space for the mounting of racks and other accessories in the interior thereof. As shown in FIG. 1, such internal structural members can be similarly mounted via the use of conventional bolts 40 and washers 42.

Through the use of our improved multi-purpose mounting block 30, there is no need to access the interior of the enclosure when it is desired to restructure the enclosure. The front door panel 26 and rear panel 28 can be easily interchanged or reversed by accessing the exterior bolts only. Moreover, less interior space is obstructed as a result of mounting necessary internal support structures 60, since such structures are simply bolted to the external mounting blocks 30, which do not obstruct the interior space of the enclosure. Such benefits are a marked improvement over conventional enclosures, and allow users of such enclosures to meet their ever-changing demands with little inconvenience.

Shown in FIGS. 7-12 is an alternative embodiment of the multi-purpose mounting block, designated as numeral 62. Mounting block 62 is designed for use with an alternative type of restructurable enclosure, which includes a modular enclosure frame upon which the various wall panels of the enclosure may be secured. As shown in FIGS. 8A and 8B, the enclosure frame is comprised of a latticework 64 of vertical and horizontal structural members or frame sections, upon which a top, bottom, front, rear, and two side panels are secured.

More specifically, latticework 64 includes vertical frame sections 72, 74, 76, and 78. Such upright frame sections are connected together at their top and bottom ends via a latticework of crossbar members 80. Latticework 64 provides an enclosure frame which defines openings over which the respective front door panel 66, rear panel 68, and side panels 70 are externally connected via the use of our multi-purpose mounting blocks. For reasons best described in co-pending patent application Ser. No. 07/799,408 entitled MULTIFACETED MODULAR ENCLOSURE FRAME WITH INTEGRAL SUB-PANEL GUIDE SYSTEM, the contents of which has been incorporated herein by reference thereto, all frame sections 72, 74, 76, and 78, and all cross bar members 80, have identical cross-sectional configurations.

Figure 7A:
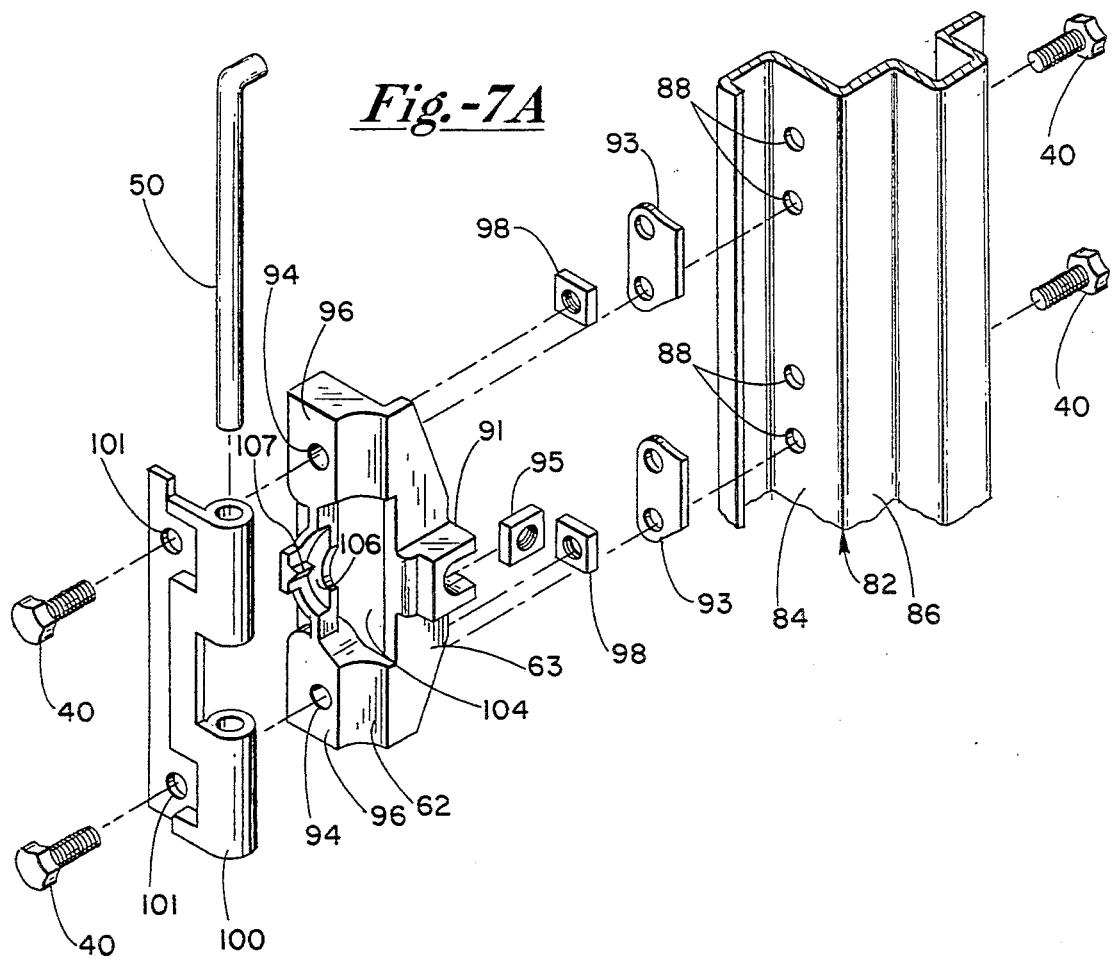
FIG. 7A is a fragmentary exploded perspective view of an alternative embodiment of our new multi-purpose mounting block, which is utilized with restructurable enclosures which have removable front, rear and side panels.
Figure 8A:
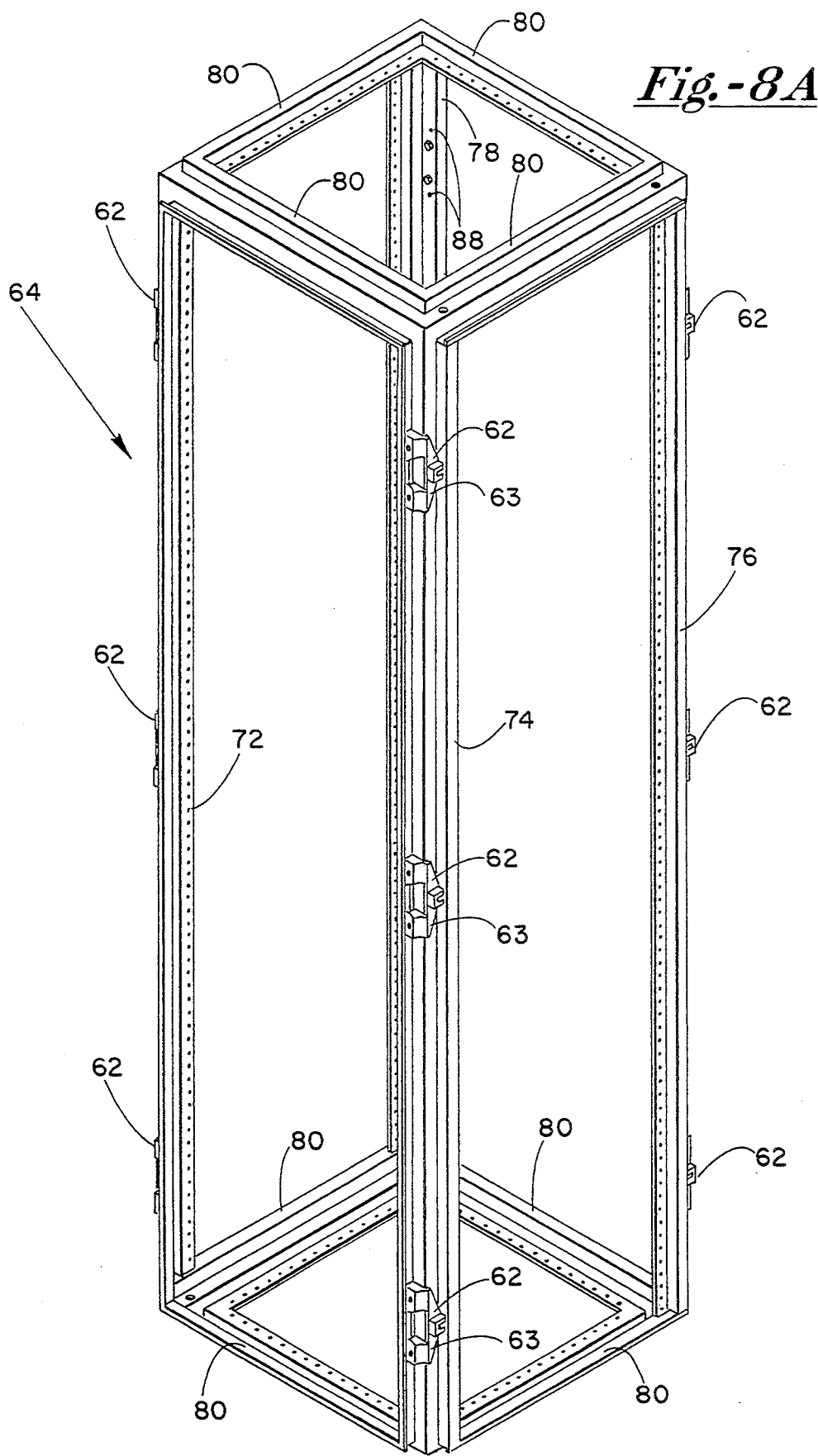
FIG. 8A is a perspective view of a modular enclosure frame assembly, showing our alternative embodiment of the multi-purpose mounting block mounted thereon at a plurality of spaced locations to provide for external connection of the various wall panels thereto.

As best shown in FIG. 8A, each upstanding frame section 72, 74, 76, and 78 is constructed to receive and carry a plurality of mounting blocks 62, which are fixedly connected thereto at corresponding locations and elevations. Because all frame sections are identically constructed, each mounting block 62 is secured to its respective frame section in the same manner. For this reason, the specific manner in which each mounting block 62 is secured to a particular frame section will be described with reference to only one such block 62, as shown in FIG. 7A.

Shown in FIG. 7A is a portion of frame section 74, showing how such a mounting block 62 is secured thereto. Frame section 74 includes an angled corner flange 82, which has a forward facing surface 84 and a side facing surface 86. Forward surface 84 has a plurality of apertures 88 extending therethrough, which are spaced and positioned in predetermined locations for cooperative alignment with the threaded bores 90 in the base surface 92 of mounting block 62 (shown in FIGS. 10 and 12). As can be seen in FIG. 7A, mounting block 62 is secured to frame section 74 via a pair of bolts 40, which extend through a pair of apertures 88, through gaskets 93 and into threaded bores 90 in the base surface 92 of mounting block 62. The remaining apertures 88 are disposed in communicating relation with the remaining bores 90 in mounting block 62, which facilitates mounting of internal racks and other assemblies. Because mounting blocks 62 are attached to the exterior of latticework 64, they provide mounts for the internal accessories without obstructing the interior of the enclosure.

Alternative mounting block 62 is characterized by an additional integral flange portion 63, which extends normal to base surface 92 in a direction away from mounting surface 96. Flange 63 of block 62 wraps around and rests against the side facing surface 86 of corner flange 82 when mounting block 62 is connected to frame section 74. As shown in FIG. 8A, flange portion 63 is disposed such that it faces outwardly toward the side of the enclosure to provide for external mounting of a side panel 70 thereto.

It is noted that several sets of apertures 88, which facilitate connection of mounting blocks 62, are spaced along the length of each upstanding frame section, and are disposed in substantially identical predetermined locations thereon to enable cooperative interchangeability and reversibility of the various door and wall panels which connect to mounting blocks 62. As best shown in FIG. 8A, each of the forward upstanding frame sections 72 and 74 include a plurality of mounting blocks 62 mounted at various predetermined spaced locations on the front surface portion 84 thereof. As stated previously, such mounting blocks 62 are mounted in cooperative relation, such that the door panel 66 may be externally mounted, removed and easily reverse mounted thereon for optional use as a right-handed or left-handed door.

Due to the identical construction of all frame sections, rear vertical frame sections 76 and 78 also include an identical angled corner flange 82, which defines a rear surface (similar to front surface 84) and a side surface 86, upon which a plurality of such mounting blocks 62 may be secured in the same manner described above. As shown in FIGS. 8A and 8B, such mounting blocks 62, which are secured to rear vertical frame sections 76 and 78, are mounted at the same elevation as those mounting blocks 62 which are mounted on front frame sections 72 and 74. Mounting such blocks 62 in substantially identical predetermined cooperative locations on vertical frame sections 72, 74, 76, and 78, provides versatility, interchangeability, and reversibility of the various wall panels of the enclosure.

With specific reference now being made to FIGS. 9–12, it can be seen that each alternative mounting block 62 includes a pair of spaced open bores 94 which extend through its body from its mounting surface 96 to its base 92. Bores 94 facilitate mounting of the front door and rear wall panels, 66 and 68, respectively, to the enclosure frame. The base surface 92 of each mounting block 62 includes a pair of substantially square openings 99, each of which aligns with a bore 94 and is designed to receive and hold therein, in relatively loose fitting relation, a locking nut 98 (shown in FIG. 7A). Recesses 97, which are formed at opposite ends of the base surface 92 of each mounting block 62, are designed to receive gaskets 93 therein. Gaskets 93 hold the respective nuts 98 within their associated openings 97 in each mounting block 62 when the same is secured to its respective frame section. Gaskets 93 also function to perfect a seal between each mounting block 62 and the corresponding aligned apertures 88 in the enclosure frame on which it is mounted, thereby preventing leakage therethrough.

Figure 7B:
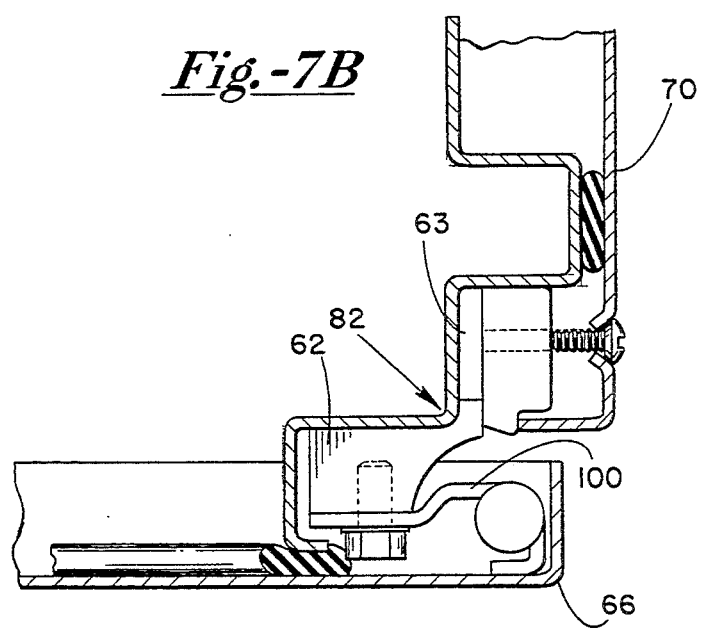
FIG. 7B is a cross-sectional view taken along a horizontal plane through an assembled restructurable enclosure similar to that shown in FIG. 8B, showing the external connection of an adjacent door and side panel to the mounting surfaces of one of the alternative mounting blocks, which is mounted on the enclosure frame.

As best shown in FIGS. 7A and 7B, each of the mounting blocks 62, which are mounted upon identically configured upstanding structural members 72 and 74, are constructed such that a door hinge 100 may be mounted on the mounting surface 96 thereof via bolts 40. Bolts 40 extend through openings 101 in hinge 100, and into apertures 94 on opposite ends of each mounting block 62 to which they are mounted. Bolts 40 secure the hinges to the mounting blocks 62 by threading into nuts 98, which are fixed in loose but stationary position within the respective openings 99 in each mounting block 62. A door panel 66 may either be hinged to the mounting blocks 62 carried by structural number 72, or be reversed and mounted on the blocks 62 which are carried by structural member 74. Of course, a door panel may also be hingedly mounted to those blocks 62 which are carried by either of the rear structural members 76 or 78.

As stated previously, openings 99 in each mounting block 62 are slightly oversized to provide a floating, loose fit for the nuts 98 therewithin. Such a floating relation provides a built-in locational alignment tolerance between the blocks 62 and the various wall panels which are mounted thereon. This is important in the event that the enclosure frame is positioned on a slanted or uneven surface.

As shown in FIG. 8B, the rear panel 68 of the modular enclosure externally mounts to latticework 64 in an identical manner to door 66, with the exception that hinge 100 is not used. Thus, rear panel 68 is connected to each of the mounting blocks 62 on rear frame sections 76 and 78 via a bolt 40, which extends through each opening 103 in rear panel 68, and into one of the apertures 94 in an aligned mounting block 62, where it can be threaded into, and secured by, a locking nut 98.

Side panels 70 externally mount to latticework 64 via the integral flange portions 63 of the various mounting blocks 62 that are connected to the frame. As seen best in FIGS. 10 and 12, flange portion 63 of each mounting block 62 includes a channeled portion 91 which is constructed to receive therein, in loose fitting relation, a securing nut 95 (shown in FIG. 7A). Similar to nut 98, a bolt 40 may be threaded into nut 95 to secure a side panel 70 to the mounting block 62.

More specifically, once a mounting block 62 is secured to a particular frame section 72, 74, 76, or 78, nut 95 is held in loose but stationary lock relation within channel member 91. Flange portion 63 wraps around the corner flange 82 of the frame section, thereby facing a side panel 70. It is readily apparent that each side panel 70 is constructed with a plurality of openings 102, each of which cooperatively aligns with the flange portion 63 of an associated mounting block 62, when the side panel 70 is properly positioned on the enclosure frame. Bolts 40 may be pushed through openings 102 of each side panel 70, and threaded into the corresponding nuts 95 which are carried within the respective channel members 91 of the associated mounting blocks 62. In this manner, each of the side panels 70 may also be mounted and removed from the modular enclosure frame solely from the exterior of the enclosure, without the need for accessing the interior thereof.

Figure 8C:
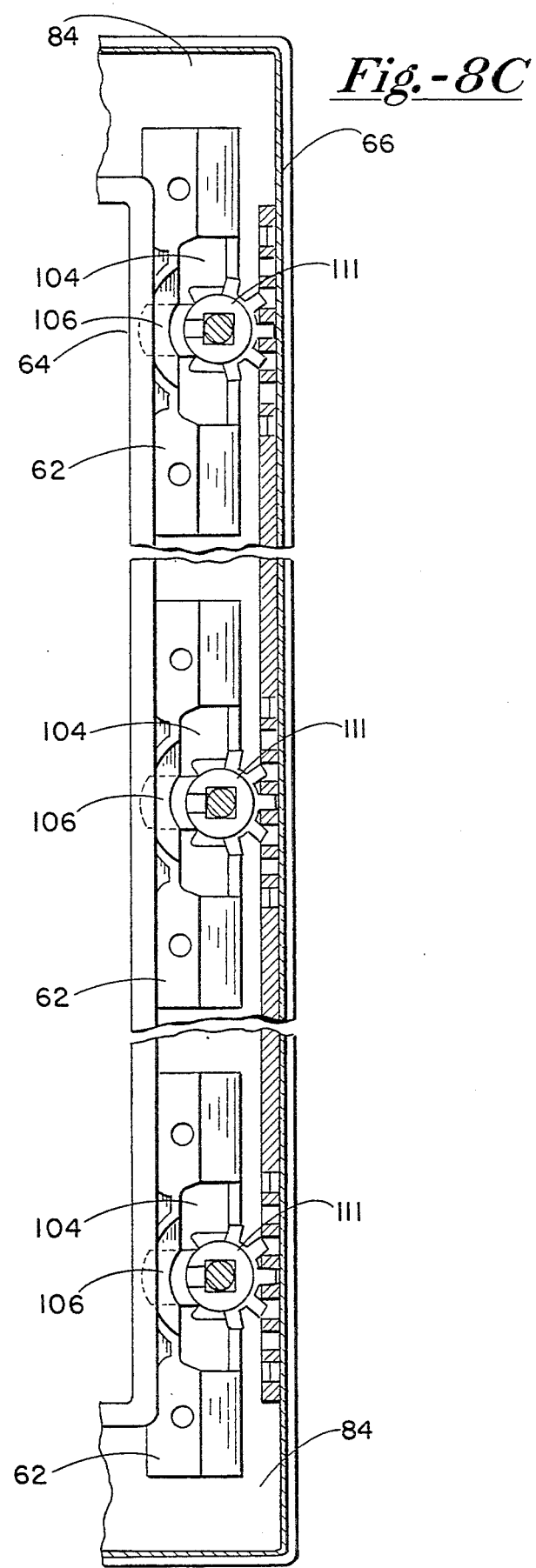
FIG. 8C is a fragmentary front vertical sectional view taken through the front closed door of an assembled enclosure similar to that shown in exploded perspective relation in FIG. 8B, showing the inter-engagement between our alternative mounting blocks and the door latching system.
Figure 9:
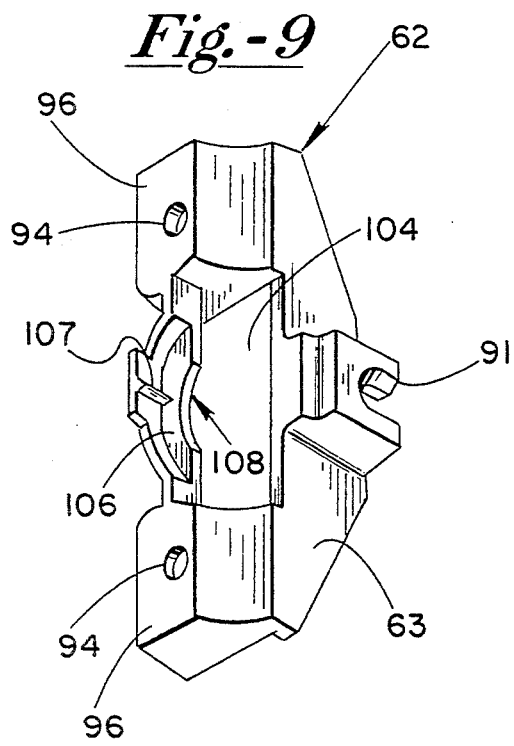
FIG. 9 is a front perspective view of the alternative multi-purpose mounting block shown in FIG. 7A.
Figure 10:
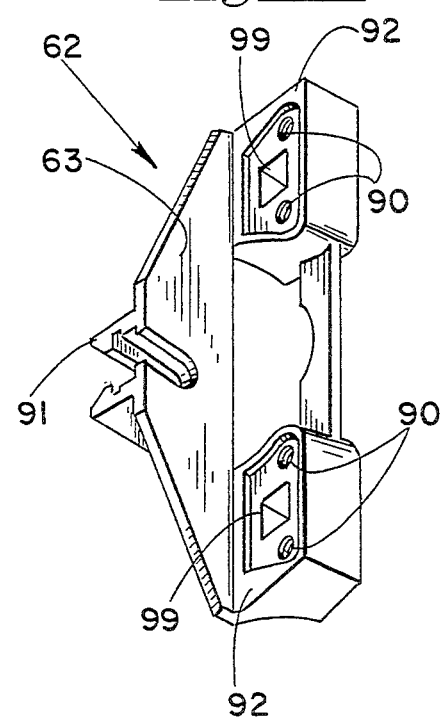
FIG. 10 is a rear perspective view of the alternative multi-purpose mounting block shown in FIG. 9.
Figure 11:
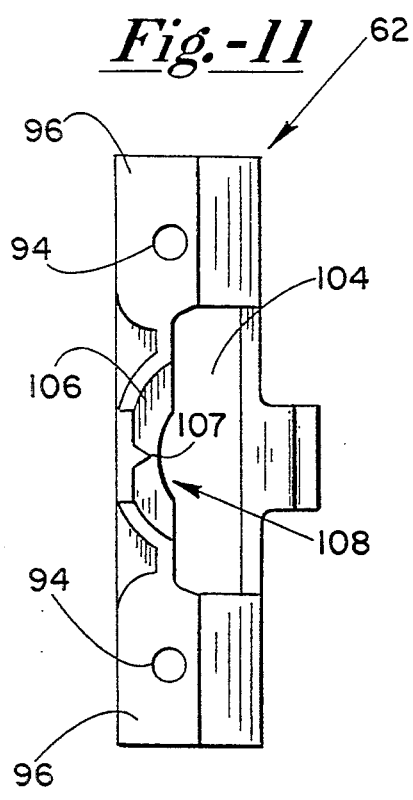
FIG. 11 is a top plan view of the alternative multi-purpose mounting block shown in FIG. 9.
Figure 12:
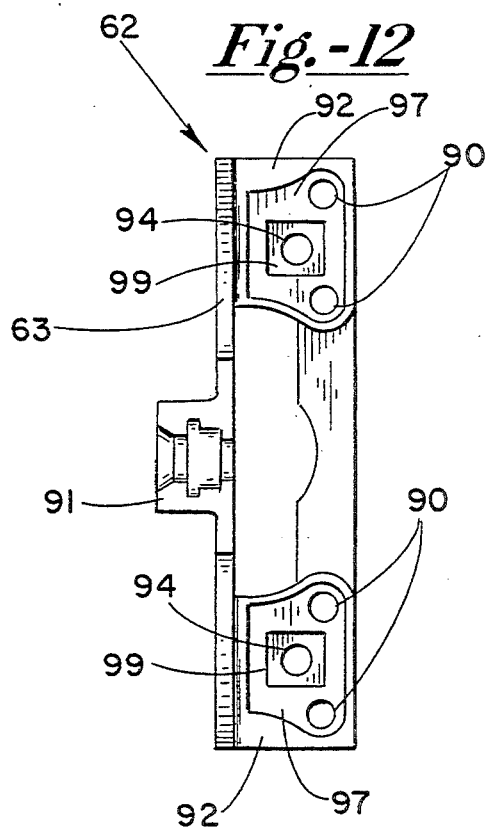
FIG. 12 is a bottom plan view of the alternative multi-purpose mounting block shown in FIG. 9.

As seen best in FIG. 9, each mounting block 62 has a centrally recessed surface 104, and an elevated bridge portion 106 spanning thereovert which defines a slot 108 therebetween. Unlike the design of mounting block 30, mounting block 62 provides the additional bridge portion 106 to function as a catch means for a single or multi-point door latching system, as shown in FIG. 8C. When door latch 110 is moved to a locked position, each associated cam-pinion 111 is caused to enter slot 108 between bridge 106 and surface 104 of its adjacent mounting block 62, thereby securing the door 66 in tightly sealed relation against the enclosure frame 64. Bridge portion 106 is also constructed with a door latch stop 107, which prevents further turning of the door latch 110 beyond a predetermined stop point, if the door panel 66 is not properly secured with each cam-pinion 111 disposed within the slot 108 of an associated mounting block.

As best seen in FIG. 8A, each frame section 72, 74, 76, and 78 carries a plurality of mounting blocks 62. Such mounting blocks 62 are spaced over the length of each frame section at appropriate positions to correspond with the locations of the hinge assemblies (not shown) which are attached to door panel 66. Consequently, if door panel 66 is hinged upon those mounting blocks 62 on frame section 72, the door latching assembly may secure to the bridge portion 106 on one or more of the mounting blocks 62 which are carried by frame section 74. In like manner, should door panel 66 be mounted upon mounting blocks 62 on frame section 74, one or more of the mounting blocks 62 carried by frame section 72 can function as a catch means for the door latching system. It is readily apparent that a door assembly 66 could be reversed with rear panel 68 and be pivotally mounted to the mounting blocks 62 on either of the rear frame sections 76 or 78, and the mounting block 62 on the opposite frame section would then function as such a catch means for the door latching system.

Figure 13:
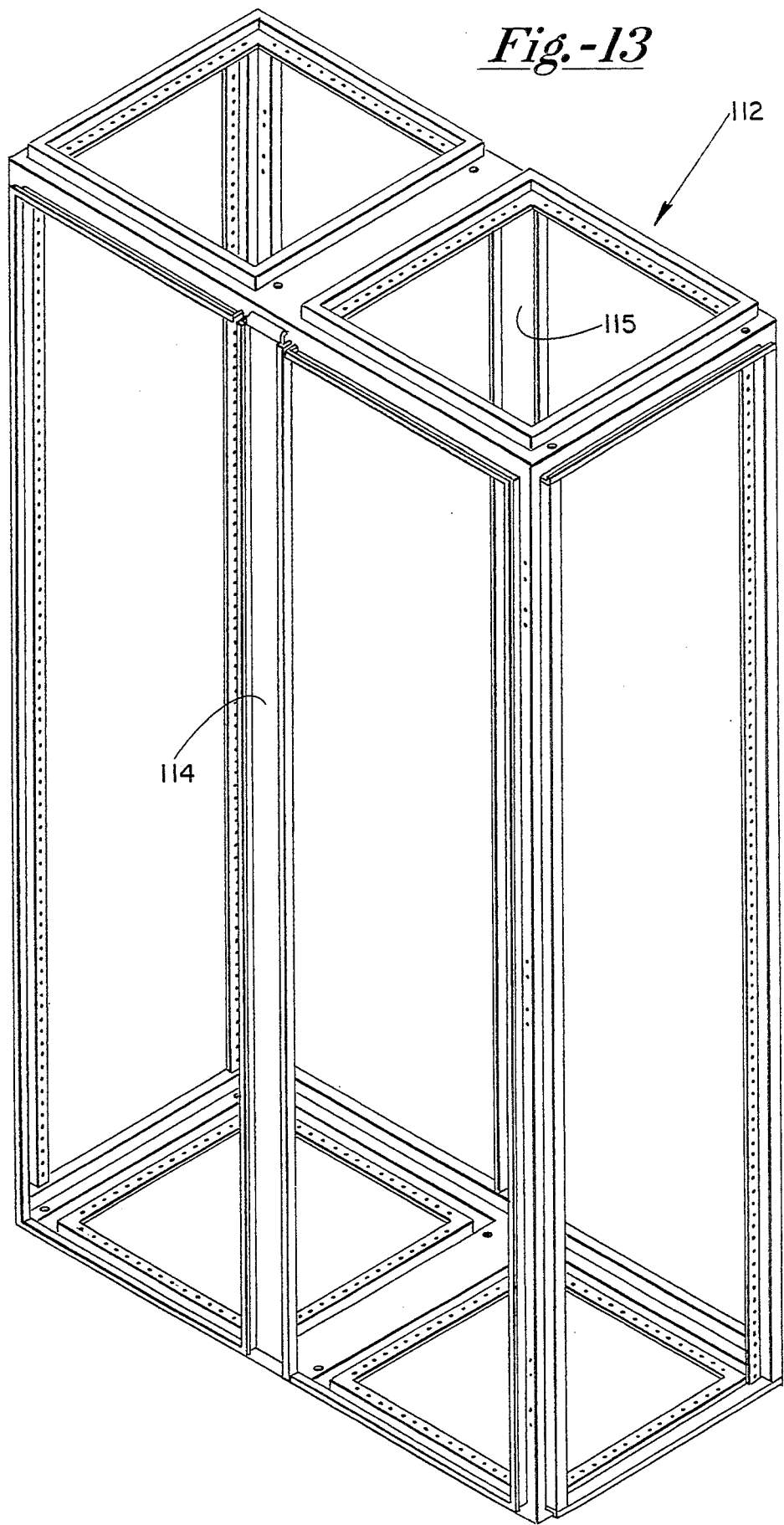
FIG. 13 is a perspective view of a modular enclosure frame for a double door enclosure, showing the connecting centerposts upon which modified mounting blocks are secured for external connection of double front door and rear panels thereto.
Figure 14:
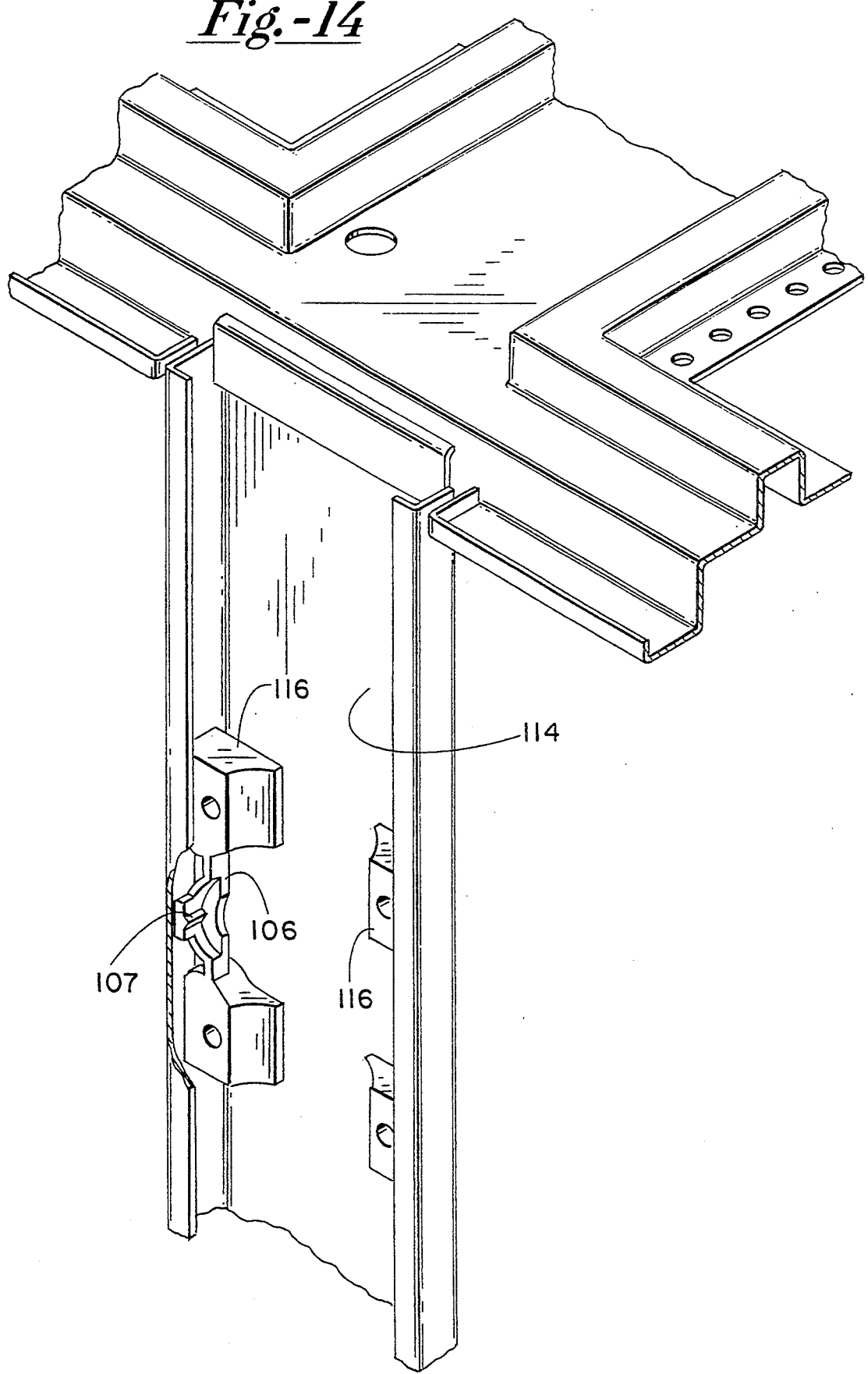
FIG. 14 is a fragmentary perspective view of the upper portion of the front centerpost of the double door enclosure frame shown in FIG. 13, showing a modified mounting block attached thereto for mounting of the front door panels.

With specific reference to FIGS. 13 and 14, it can be seen that modular enclosure frames, such as that defined by latticework 64, can be interconnected to form a larger double door enclosure frame 112, which is capable of carrying a pair of door panels 66 on the front side thereof, and a pair of rear panels 68 on the rear side thereof. In forming the double door enclosure frame 112, forward and rear centerposts 114 and 115 are provided which carry a plurality of modified mounting blocks 116. Each block 116 is cooperatively positioned at the same elevations of other blocks 62 to provide for interchangeability and reversibility of the various enclosure door and wall panels.

Mounting blocks 116 are constructed identically to mounting blocks 62, with the exception that flange portion 63 and surface 104 have been eliminated. Bridge portion 106 is retained in the modified mounting block 116, however, so as to provide a catch means for the door latching systems which are carried by the pair of door panels 66. Bridge 106 on each modified mounting block 116 also includes a stop 107 to prevent improper locking of door panels 66.

It is readily apparent that use of our multi-purpose mounting blocks in connection with electrical enclosures of the type described herein, provides the user thereof with a multitude of options for restructuring such enclosures and/or accessing certain areas therewithin without the need for removing numerous interior accessories. Any specific door or wall panel may be easily removed, reversed or interchanged with other panels, solely from the exterior of the enclosure. Interior racks and other assemblies may be connected directly to the exterior mounting blocks, thereby avoiding the need for separate internal connectors which take up valuable space. Such mounting blocks may also provide the function of a catch means for a single or multi-point door latching system. The above benefits obtained through the use of our multi-purpose mounting blocks establishes a marked improvement over conventional enclosures, which are more cumbersome and time consuming to manufacture and use, and lack the versatility of an enclosure as described above.

It will, of course, be understood that various changes may be made in the form, details, arrangement and proportions of the parts without departing from the scope of the invention which comprises the matter shown and described herein and set forth in the appended claims.

We claim:

1. A readily restructurable free-standing portable enclosure, comprising:
   (a) a free-standing portable enclosure body having opening-defining portions defining a substantially rectangular opening over which at least one front door panel is cooperatively positioned;
   (b) a plurality of spaced rigid mounting blocks connected to said enclosure body adjacent said opening-defining portions thereof, a predetermined number of said blocks being positioned adjacent one side of said opening at predetermined elevations and a predetermined number of said blocks being correspondingly positioned at substantially the same said elevations adjacent the opposite side of said opening;
   (c) each said block having a base surface which abuts said enclosure body upon mounting of said block thereto, and a mounting surface facing oppositely of said base surface, each said block having means for externally connecting said door panel in pivotal relation to said mounting surface thereof; and
   (d) said door panel being externally connected in pivotal relation to each of said blocks adjacent one side of said opening and readily reversible for similar pivotal and external connection to said corresponding blocks adjacent said opposite side of said opening.

2. The structure defined in claim 1, wherein said means for externally connecting said door panel comprises at least one top bore extending from said mounting surface of each said block through to said base surface thereof, within which a mounting bolt is inserted and secured to facilitate mounting of said door panel to said block.

3. The structure defined in claim 2, wherein each of said blocks is elongated with opposite end portions, said end portions having substantially greater cross-sectional dimensions between said mounting surface and said base surface than the cross-sectional dimensions of an intermediate portion of said block between said end portions, and each of said end portions having at least one said top bore therein.

4. The structure defined in claim 1, wherein said side panels each have front end portions which are bent inwardly toward each other in a plane substantially normal to said respective side panels to define portions of said door opening and to provide flanges upon which said mounting blocks are secured.

5. The structure defined in claim 4, wherein each of said blocks have a major cross-sectional dimension between said base surface and said mounting surface, and each said inwardly extending flange has a free end portion which is bent such that it extends outwardly away from said enclosure a distance greater than said major cross-sectional dimension of each of said blocks.

6. A readily restructurable free-standing portable enclosure, comprising:
   (a) a free-standing portable enclosure body having opening-defining portions defining a substantially rectangular opening over which at least one front door panel is cooperatively positioned;
   (b) a plurality of spaced rigid mounting blocks connected to said enclosure body adjacent said opening-defining portions thereof, a predetermined number of said blocks being positioned adjacent one side of said opening at predetermined elevations and a predetermined number of said blocks being correspondingly positioned at substantially the same said elevations adjacent the opposite side of said opening;
   (c) each said block having a base surface which abuts said enclosure body upon mounting of said block thereto, and a mounting surface facing oppositely of said base surface, each said block having at least one top bore extending from said mounting surface through to said base surface thereof, within which a mounting bolt may be inserted and secured for connecting said door panel in pivotal relation to said mounting surface thereof;
   (d) said door panel being externally connected in pivotal relation to each of said blocks adjacent one side of said opening and readily reversible for similar pivotal and external connection to said corresponding blocks adjacent said opposite side of said opening;
   (e) each of said blocks being elongated with opposite end portions, said end portions having substantially greater cross-sectional dimensions between said mounting surface and said base surface than the cross-sectional dimensions of an intermediate portion of said block between said end portions, and each of said end portions having at least one said top bore therein; and
   (f) each of said end portions of each of said blocks including a plurality of bottom bores which extend from said base surface toward said mounting surface thereof, each of said blocks being positioned on said enclosure body such that each said bottom bore therein is in cooperative alignment with an aperture through said enclosure body, said bottom bores providing means for receiving mounting means for mounting each said block to said enclosure body and for mounting support members within the interior of such an enclosure.

7. A readily restructurable free-standing portable enclosure, comprising:
   (a) a free-standing portable enclosure body having opening-defining portions defining a substantially rectangular opening over which at least one front door panel is cooperatively positioned;
   (b) a plurality of spaced rigid mounting blocks connected to said enclosure body adjacent said opening-defining portions thereof, a predetermined number of said blocks being positioned adjacent one side of said opening at predetermined elevations and a predetermined number of said blocks being correspondingly positioned at substantially the same said elevations adjacent the opposite side of said opening;
   (c) each said block having a base surface which abuts said enclosure body upon mounting of said block thereto, and a mounting surface facing oppositely of said base surface, each said block having means for externally connecting said door panel in pivotal relation to said mounting surface thereof;
   (d) said door panel being externally connected in pivotal relation to each of said blocks adjacent one side of said opening and readily reversible for similar pivotal and external connection to said corresponding blocks adjacent said opposite side of said opening; and
   (e) a second plurality of mounting blocks mounted in spaced relation to each other on said enclosure body and constructed and arranged to provide for external connection of a rear wall panel to said enclosure body, said second plurality of mounting blocks being disposed in such position as to provide for cooperative interchangeability between said rear wall panel and said door panel.

8. The structure defined in claim 7, wherein all of said mounting blocks are identically constructed, each of said mounting blocks having a plurality of top bores extending from said mounting surface through to said base surface, and a plurality of bottom bores extending from said base surface toward said mounting surface, each of said bottom bores communicating with an adjacent aperture in said enclosure body and providing means for mounting interior support members within such an enclosure, said top bores providing means for external connection of said rear panel and said door panel to said mounting blocks.

9. A readily restructurable free-standing portable enclosure, comprising:
   (a) a free-standing portable enclosure body having opening-defining portions defining a substantially rectangular opening over which at least one front door panel is cooperatively positioned;
   (b) a plurality of spaced rigid mounting blocks connected to said enclosure body adjacent said opening-defining portions thereof, a predetermined number of said blocks being positioned adjacent one side of said opening at predetermined elevations and a predetermined number of said blocks being correspondingly positioned at substantially the same said elevations adjacent the opposite side of said opening;
   (c) each said block having a base surface which abuts said enclosure body upon mounting of said block thereto, and a mounting surface facing oppositely of said base surface, each said block having means for externally connecting said door panel in pivotal relation to said mounting surface thereof;
   (d) said door panel being externally connected in pivotal relation to each of said blocks adjacent one side of said opening and readily reversible for similar pivotal and external connection to said corresponding blocks adjacent said opposite side of said opening; and
   (e) each of said blocks has a plurality of bottom bores extending from said base surface toward said mounting surface, each of said blocks being positioned on said enclosure body such that each said bottom bore therein is disposed in communicating alignment with an adjacent aperture in said enclosure body, at least some of said bottom bores providing means for receiving mounting means for mounting said block to said enclosure body.

10. The structure defined in claim 9, wherein some of said bottom bores are constructed and arranged to provide a means for mounting structures within the interior of such an enclosure.

11. A readily restructurable free-standing portable enclosure, comprising:
   (a) a free-standing portable enclosure body with opening-defining portions defining a generally rectangular opening over which at least one door panel is cooperatively positioned;
   (b) a plurality of rigid mounting members connected to said enclosure body at spaced locations adjacent to said opening-defining portions, wherein a first predetermined number of said mounting members are positioned on one side of said opening, and a second predetermined number of said mounting members are positioned on the opposite side of said opening;
   (c) each of said mounting members being constructed and arranged with means for externally connecting said door panel thereon in pivotal and readily removable relation thereto, said means for external connection being accessible from the exterior of said enclosure body and devoid of any structure extending within said enclosure; and
   (d) said door panel being pivotally mounted to at least some of said first predetermined number of said mounting members and readily removable and reversible for similar pivotal mounting to at least some of said second predetermined number of said mounting members without the need for removal of any of said mounting members.

12. The structure defined in claim 11, including a second plurality of said mounting members connected to said enclosure at spaced locations and in such an arrangement as to provide means for readily removable external connection of at least one of said wall panels to said enclosure.

13. The structure defined in claim 12, wherein at least one of said wall panels which is externally connected to said second plurality of mounting members is constructed and arranged to be interchangeable with said door panel.

14. The structure defined in claim 11, wherein said means for externally connecting said door panel comprises at least one open bore through each said mounting member into which a bolt is inserted for cooperative engagement with a locking nut.

15. The structure defined in claim 11, wherein each of said mounting members is comprised of an elongated block with end portions and an intermediate portion therebetween, said block having a substantially flat base surface for mounting said block to said enclosure body, and an oppositely disposed mounting surface, the transverse dimensions between said base surface and said mounting surface being greater near said end portions of said block than said intermediate portion of said block.

16. The structure defined in claim 15, wherein said end portions of each said block include means for receiving mounting means for mounting said block at said base surface to said enclosure body and means for receiving mounting means for pivotally mounting said door panel to said mounting surface by external connection thereto.

17. The structure defined in claim 11, wherein said mounting member has a substantially flat base surface and an oppositely disposed mounting surface, said mounting member including means for receiving mounting means for mounting said base surface of said mounting member to said enclosure body and means for receiving mounting means for pivotally mounting said door panel to said mounting surface by external connection.

18. The structure defined in claim 17, wherein said base surface of each said mounting member abuts said enclosure body, and each said mounting member includes means for mounting structures within the interior of said enclosure.

19. The structure defined in claim 18, wherein said means for pivotally mounting said door panel to said mounting surface of said mounting member comprises at least one bore extending from said mounting surface thereof through to said base surface thereof to provide for mounting of a hinge assembly thereto which is capable of being connected to said door panel.

20. The structure defined in claim 11, wherein includes a rear wall panel is disposed opposite said door panel, said rear wall panel being externally connected to a plurality of second mounting members which are mounted to said enclosure body in such arrangement as to provide for interchangeability between said door panel and said rear panel.

21. The structure defined in claim 11, wherein at least one of said mounting members which are disposed on the opposite side of said opening relative to where said door panel is pivotally connected to said enclosure body is constructed and arranged to provide a catch upon which a door latch of said door panel may engage and lock.

22. A readily restructurable free-standing portable enclosure, comprising:
   (a) an enclosure frame upon which at least one door panel and a plurality of wall panels are connected to define a free-standing portable enclosure having opening-defining portions defining at least one opening over which said door panel is cooperatively positioned;
   (b) a plurality of rigid mounting members connected to said enclosure frame at spaced locations thereabouts, a first set of said mounting members being positioned adjacent one side of said opening and a second set of said mounting members being positioned adjacent the opposite side of said opening, each of said mounting members being constructed and arranged to facilitate external connection of at least said door panel to said enclosure frame, said door panel being pivotally connected to at least some of said first set of said mounting members and movable between open and closed positions relative to said enclosure; and
   (c) said door panel being removable and reversible for similar pivotal and external connection to at least some of said second set of said mounting members.

23. The structure defined in claim 22, wherein each said mounting member is constructed and arranged to provide an integral mounting surface for two of said panels which are disposed adjacent to one another.

24. The structure defined in claim 22, wherein said wall panels include a rear panel and opposite side panels which are externally connected to said mounting members, and interconnected thereby.

25. The structure defined in claim 24, wherein said enclosure frame has front surface portions and rear surface portions, a predetermined number of said mounting members being connected to said front surface portions and a predetermined number of said mounting members being connected to said rear surface portions, each of said mounting members which are connected to said front surface portions of said enclosure frame being constructed and arranged to be capable of providing for pivotal external connection of said front door panel and external connection of an adjacent said side panel, and each of said mounting members which are connected to said rear surface portions of said enclosure frame being constructed and arranged to provide for external connection of said rear wall panel and an adjacent said sidewall panel.

26. The structure defined in claim 24, wherein said door and wall panels have peripheral edges and said enclosure frame comprises a latticework of interconnected structural supports which support said door and wall panels adjacent their said peripheral edges, said mounting members being connected to the exterior surface of at least some of said structural supports, and constructed and arranged to facilitate external connection of said door and wall panels thereto.

27. The structure defined in claim 26, wherein each said mounting member is constructed and arranged to cooperatively engage and wrap partially around one of said structural supports of said enclosure frame, so as to provide an integral mounting surface for external connection of an adjacent door and side wall panel, or an adjacent rear and side wall panel.

28. The structure defined in claim 22, wherein each of said mounting members has a base surface and a mounting surface, each of said mounting members further including a plurality of bores extending inwardly from said base surface toward said mounting surface to facilitate connection of said mounting members to said enclosure frame.

29. The structure defined in claim 28, wherein said enclosure frame has apertures and each of said mounting members are positioned such that said bores cooperatively align with said apertures in said enclosure frame, some of said bores being constructed and arranged to provide for unobstructed mounting of internal accessories within said enclosure.

30. The structure defined in claim 28, wherein said mounting members include at least one open bore extending therethrough from said mounting surface to said base surface, said open bore being constructed and arranged to receive a bolt therethrough for cooperative engagement with a nut on the opposite side thereof, thereby facilitating external connection of said door and wall panels thereto.

31. The structure defined in claim 22, wherein said mounting members are cooperatively positioned so that at least some of said various door and wall panels may be readily interchanged.

32. The structure defined in claim 22, wherein said mounting members are constructed and arranged to provide reversibility of said door panel without accessing the interior of said enclosure.

33. The structure defined in claim 22, wherein said door panel includes a means for latching said door panel to at least one of said mounting members, and each of said mounting members is constructed and arranged with a means for catching said latch means of said door panel, whereby at least one of said mounting members which are disposed on the opposite side of said door opening as said mounting members to which said door panel is pivotally connected will provide a catch for said door latch means of said door panel.

34. The structure defined in claim 22, wherein at least one of said mounting members is constructed, arranged, and connected to said frame in a position such that it provides a catch for a door panel latching means which is carried by said door panel.

35. The structure defined in claim 34, wherein said mounting member which comprises a catch for said door panel latching means includes a door latch stop means to prevent improper latching of said door panel to said enclosure.

* * * * *

UNITED STATES PATENT AND TRADEMARK OFFICE
CERTIFICATE OF CORRECTION

PATENT NO. : 5,407,263
DATED : April 18, 1995
INVENTOR(S) : Jones et al

It is certified that error appears in the above-identified patent and that said Letters Patent is hereby corrected as shown below:

Column 10, line 23, change "thereovert" to --thereover--.

Column 15, lines 44-45, delete "includes".

Signed and Sealed this

Seventeenth Day of October, 1995

Attest:

BRUCE LEHMAN

Attesting Officer    Commissioner of Patents and Trademarks